United States Patent Office 3,148,052

Patented Sept. 8, 1964

3,148,052

BORON DOPING ALLOYS

Thorndike C. T. New, Greensburg, Pa., assignor to Westinghouse Electric Corporation, East Pittsburgh, Pa., a corporation of Pennsylvania No Drawing. Filed Feb. 27, 1961, Ser. No. 91,599
4 Claims. (Cl. 75—134)

This invention relates to P-type doping materials particularly for use in making semiconductor devices, and methods of making the same.

In the manufacture of semiconductor devices, it is known that the conductivity type of a semiconductor material is determined by certain impurities in the material. Donor impurities comprising primarily pentavalent materals, make intrinsic semiconductor materials N-type whereas acceptor impurities comprising primarily trivalent materials make intrinsic semiconductor materials P-type. To impart P-type conductivity to semiconductor materials it has been found highly desirable to use boron as an acceptor impurity because of its high solubility, particularly in silicon.

The electrical conductivity and functioning characteristics of a semiconductor material are affected significantly by the distribution of the conductivity determining impurity in the otherwise intrinsc material. It is desired in many instances that the impurity be completely and uniformly distributed in selected portions of the semiconductor material. In many cases contact pellets are applied to semiconductor members to alloy with the surface of the semiconductor material and to dope the adjacent portions thereof to produce an alloy junction. This, however, is not always readily possible because of unfavorable alloying characteristics of various materials commonly used.

In processes involving the doping of semi-conductors, a carrier metal is preferably selected which either does not ionize when molten or which has an extremely small segregation coefficient with respect to the segregation coefficient of the doping agent. Among the more commonly used carrier metals are silver, copper, gold, lead and tin. Lead and tin do not ionize in silicon or germanium crystals because they are tetravalent, providing no free electrons nor causing electron deficiencies. Silver and gold are known to ionize in silicon and germanium, having some effect on the conductivity of such materials. Pure gold has an N-type doping characteristic. However, it is desirable to employ these metals, regardless, because of their comparatively low segregation coefficients with respect to other N-type conductivity determining impurities as shown in Table I below:

*Table I*

| | K in germanium ($10^{-6}$) | K in silicon ($10^{-6}$) |
|---|---|---|
| Copper | 15 | 400 |
| Gold | 3,000 | 30-100 |
| Antimony | 30,000 | 300,000 |
| Boron | $20X10^6$ | 9000,00 |
| Tin | 20,000 | 1 |

In the production of silicon or germanium P-N alloyed junctions, pellets of gold are often used as a carrier metal for a doping impurity because of its low eutectic temperatures and fairly good wetting properties. For P-type doping, however, it has been very difficult in using gold as a carrier because of the low segregation coefficients of most P-type doping agents therein and also because of the gold being N-type without any doping ingredient. Boron has a sufficiently high segregation coefficient but is extremely difficult to allow with gold because it almost is immiscible in gold. Boron is an extremely high melting point metal—about 2300° C.—and even its eutectics with many metals have a very high melting point. It ofen segregates out readily from most binary solutions when a melt is solidified.

Accordingly, the general object of this invention is to provide an improved member of a P-type doping alloy of gold and boron to apply to semiconductor materials and a method for preparing the same.

Another more specific object of this invention is to provide an improved alloy suitable for P-type doping of semiconductor materials wherein the conductivity determining impurity comprises boron in selected amounts uniformly distributed in a selected carrier metal selected from one or more of the group of silver, lead, tin and gold.

A further object of this invention is to provide a semiconductor device comprising a silicon member and a gold-boron doping alloy fused to one surface thereof to produce an area having P-type conductivity at said surface.

Another object of this invention is to provide a method of preparing an alloy for use to produce P-type doping in semiconductor materials wherein a uniformly distributed in a gold base alloy.

These and other objects of the invention will become more clearly apparent from the following description.

It has been found that the inherent adverse characteristic of gold being an N-type doping material in a P-type material can be successfully overcome in the preparation of a P-type doping alloy employing gold as a carrier by using as a P-type doping agent having a high segregation coefficient, K, boron which has a K factor in silicon of approximately 0.9.

Boron alone is not readily soluble in the solid phase of most carrier metals so that a satisfactory gold-boron binary allow cannot be prepared. In accordance with the invention, a uniform carrier metal-boron P-type doping alloy is made by first preparing a master alloy consisting of boron and a second metal in which boron is readily soluble both in the liquid and solid phase, the boron and the second metal form a eutectic having a melting point not too far removed from that of the carrier metal, and which second metal is readily soluble in the carrier metal selected from at least one of the group consisting of silver, gold, lead and tin. The master alloy is then dissolved in a molten body of the carrier metal to provide a ternary P-type doping alloy consisting of a major proportion of the carrier metal, a uniform distribution of the boron in the carrier metal both in the liquid and solid phases along with the second metal, which is relatively inactive, and serves as a sub-carrier for the boron in the first carrier metal.

For use as the second metal, there may be employed a number of metals which will form alloys with boron having low eutectic temperatures and which are readily soluble in the carrier metals, particularly in gold. These second metals include platinum, copper, iron, rhodium, ruthenium, palladium, osmium and iridium, and alloys of two or more. Thus, a platinum-rhodium alloy may be used as the second metal. Boron is added to the second metal in an amount to produce the eutectic composition or a composition close to the eutectic.

The high solubility of boron in semiconductor materials including silicon, germanium, silicon-germanium alloys and groups III–V compounds requires rather small amounts of boron to accomplish the desired degree of doping. Gold containing as little as one part per million by weight of boron is capable of introducing sufficient boron for doping a layer of silicon to $10^{-18}$ to $10^{-19}$ atoms per cubic centimeter. Therefore, only a small amount of the master alloy containing a high proportion of boron—e.g., 10 to 60% by weight—is needed, in the order of less than 1% by weight of the carrier metal, the balance, over 99% being the carrier metal.

The carrier metal may comprise gold, silver, tin or lead or alloys of two or more. Gold is exceptionally effective for many purposes in the semiconductor art. Silver also has many of the desirable properties of gold, including a high melting point and good wetting of semiconductors. Alloys of silver or gold with varying proportions of tin and lead may be prepared. Thus, 90% gold–10% lead; 95% silver–4% lead–1% tin; and 80% gold–20% silver alloys may be employed. High gold and silver content alloys, for example, those containing above 60 of either or both, will exhibit good properties such as high melting temperature and good wetting and alloying with silicon.

In accordance with one embodiment of the invention, a P-type doping alloy containing gold as a carrier metal and boron as the doping agent is prepared by first preparing a master alloy comprising essentially 40% by weight of boron and 60% by weight of platinum. The master melt is then dissolved in molten gold in proportions of not more than 1% by weight of master alloy. The resultant melt is maintained in the 1100° C.–1200° C. temperature range for one hour to obtain a substantially uniform distribution of the boron in the gold. The melt is then quenched to avoid undue segregation or separation on crystallization. Other master alloys are similarly introduced into gold, gold-lead, or gold-tin or silver carrier metal.

The master alloy basically comprises a eutectic composition of boron and the second metal or metals selected from the group of metals set out above, the eutectic having a melting point close to that of the carrier metal. By reason of the fact that the melting points are not too far removed, the entire alloy is completely miscible. It is sometimes preferable, however, that the master alloy be made with a proportion of the second metal in excess of the eutectic composition. The precise proportions of the master alloy and its composition are maintained so that an equivalent of from 10 to 1,000 parts per million by weight of boron in the carrier metal is obtained. A preferred proportion is about 100 parts per million of boron.

The quenched ternary alloy body can be worked as by forging and cold rolling into sheets, strips, bar, rod or foil form. The worked shape can be cut or punched into pellets or various shaped members which can be applied to the surfaces of a semiconductor member. Upon heating an alloy pellet to the melting temperature of gold-silicon alloy or slightly above, the pellet will melt and alloy with the silicon or other semiconductor member to which it is applied. The boron will alloy with the silicon and dope it to produce P-type semiconductivity in the portion which recrystallizes on cooling. The gold pellet can be easily soldered or brazed to in order to provide electrical leads.

A ternary P-type doping alloy thus produced has wide application in producing highly concentrated P-type conductivity in intrinsic, N-type or even weakly P-type semiconductor materials. The ternary alloy also can be employed in several of the conventional doping processes including the direct addition of a doping agent into a melt of silicon, vapor deposition, etc.

Owing to the high wetting properties of silicon in particular and low segregation coefficient of the gold and the relative inactivity of the second metal, a highly uniform concentration of the boron in the doped semiconductor portions is obtained, thereby resulting in a high quality P-type semiconductor product.

In using the ternary alloy for doping purposes, the ternary alloy containing boron can be fused to areas of a semiconductor member having N-type conductivity to form a P-N junction therein.

It will be understood that the above description is only illustrative of the invention.

What is claimed is:

1. An alloy suitable for use to produce P-type doping in semiconductor materials comprising at least 99%, by weight, of at least one first metal selected from the group consisting of gold, silver, lead, and tin and the balance consisting essentially of an alloy of boron and at least one second metal, readily soluble in the first metal, selected from the group consisting of platinum, copper, rhodium, ruthenium, palladium, osmium and iridium, the boron being present in an amount to provide from 10 to 1000 parts of boron per million parts of the first metal, the alloy having a melting point relatively close to that of the first metal and dissolving readily in the first metal so that upon solidification of the resulting ternary alloy a substantially uniform distribution of boron in the first metal is obtained.

2. A ternary alloy suitable for use to produce P-type doping in semiconductor materials, the ternary alloy comprising at least 99%, by weight, of gold and the balance consisting essentially of a master alloy of substantially 40% by weight of boron and 60% by weight of platinum dissolved in the gold whereby the solidified ternary alloy consists of a substantially uniform distribution of boron in the gold.

3. In a semiconductor device, a silicon member and a doping alloy fused to one surface of the silicon member to produce and area having P-type semiconductivity at said surface consisting of at least 99%, by weight, of a first metal selected from at least one of the group consisting of gold, silver, lead and tin and the balance consisting essentially of an alloy of boron and a second metal, readily soluble in the first metal, selected from the group consisting of platinum, copper, rhodium, ruthenium, palladium, osmium and iridium, the boron being present in an amount to provide from 10 to 1000 parts of boron per million parts of the first metal, the alloy having a melting point relatively close to that of the first metal and dissolving readily in the first metal whereby the solidified alloy comprises a substantially uniform distribution of boron in the first metal.

4. In a semiconductor device, a silicon member and a doping alloy fused to one surface of the silicon member to produce an area having P-type conductivity at said surface, the alloy consisting of at least 99%, by weight, of gold and the balance consisting essentially of a master alloy of substantially 40%, by weight, of boron and 60%, by weight of platinum whereby the solidified alloy has a substantially, uniform distribution of boron in the gold.

References Cited in the file of this patent

UNITED STATES PATENTS

| | | |
|---|---|---|
| 1,577,995 | Wise | Mar. 23, 1926 |
| 2,221,286 | Hensel et al. | Nov. 12, 1940 |
| 2,829,999 | Gudmundsen | Apr. 8, 1958 |
| 2,986,481 | Gudmundsen | May 30, 1961 |
| 3,060,018 | Desmond | Oct. 23, 1962 |

OTHER REFERENCES

Hansen: Constitution of Binary Alloys, McGraw-Hill Book Co. Inc., New York, 1958. Relied on pages 246, 248, 249, and 257.